July 12, 1966 J. F. BERES ETAL 3,260,946

TRANSISTOR AMPLIFIER WITH BIAS COMPENSATION

Filed May 23, 1963 2 Sheets-Sheet 1

INVENTORS
JOHN F. BERES
HAROLD LARRY WEIL
BY Robert D. Sanborn
ATTORNEY

July 12, 1966 J. F. BERES ETAL 3,260,946

TRANSISTOR AMPLIFIER WITH BIAS COMPENSATION

Filed May 23, 1963 2 Sheets-Sheet 2

INVENTORS
JOHN F. BERES
HAROLD LARRY WEIL
BY
Robert D. Santon
ATTORNEY

United States Patent Office 3,260,946
Patented July 12, 1966

3,260,946
TRANSISTOR AMPLIFIER WITH BIAS COMPENSATION

John F. Beres, Southampton, and Harold Larry Weil, Philadelphia, Pa., assignors to Philco Corporation, Philadelphia, Pa., a corporation of Delaware
Filed May 23, 1963, Ser. No. 282,647
10 Claims. (Cl. 330—17)

This invention relates to electrical signal amplifiers, and, in particular, to transistor power amplifiers utilizing bias stabilization and direct coupling.

In the design of transistor power amplifier circuits, e.g., those used for driving loudspeakers, several serious problems have been manifest. Foremost is the relatively high leakage current which passes from the collector to the base of power transistors. This leakage current, designated $I_{cbo}$, creates voltage drops as it passes through circuit impedances, thus affecting transistor bias and ultimately circuit performance. The effects of the leakage current cannot be easily compensated for the following reasons.

Firstly, the leakage current varies between individual transistors of the same type: hence individual bias circuits custom-designed for each transistor are theoretically necessitated. This is obviously untenable from a production and marketing standpoint.

One solution is to segregate transistors of each type into groups, each group representing a preselected range of leakage currents, and design a different bias circuit for each group. This is likewise undesirable from a cost standpoint and because of service replacement complications.

Another solution is to supply variable bias components, e.g., potentimeters, which are initially adjusted to the individual transistor's requirement. This is also unsatisfactory because adjustable potentiometers introduce problems of component reliability and misadjustment.

Secondly, the leakage current of individual transistors, and therefore the resulting bias, varies considerably with normal ambient temperature changes and variations in thermal conductivity between the transistor and its support or surroundings. This problem, more serious than the first, can be partially obviated by the use of special bias components which change value with temperature, e.g., thermistors, and thus compensate leakage current changes. The drawback here, however, is that such special components can only provide correct thermal compensation for a given set of conditions of voltage, components, etc. If these conditions change, the special components no longer provide proper compensation for changes in transistor parameters.

Another partial solution to leakage current changes is the use of inverse feedback circuitry. As heretofore extant, however, such circuitry has been extremely complex, necessitating a large number of components and highly unconventional circuit arrangements. In addition, the gain of the associated amplifier has been greatly reduced by the high degree of negative feedback required.

In addition to the leakage current problem, the problem of variable transistor beta complicates the design of transistor power amplifiers. The beta of a transistor is defined as its current amplification factor, i.e., the ratio of collector to base current. Beta varies between individual transistors of the same type and creates difficulties similar to those caused by the variable leakage current. Previous solutions to the beta problem have been similiar to those used to overcome the leakage current problem, and, consequently, have heretofore been unsatisfactory.

OBJECTS

These objects, therefore, of the present invention are:

(1) To provide transistor amplifier circuits which completely obviate the leakage current problem without any of the above-noted disadvantages, (2) To provide transistor amplifier circuits in which variable beta is compensated, (3) To provide transistor amplifier circuits which are of simple construction, use no special temperature compensating components, driver or interstage transformers, or interstage or coupling capacitor, and (4) To provide transistor amplifiers wherein relaxed tolerances on all components are permitted and which are extremely reliable and impervious to even experimentally forced high leakage currents.

SUMMARY

In its general form, the amplifier of the present invention utilizes two cascaded direct-coupled transistors to directly drive a power output transistor which is cascaded to the former two. All three transistors are arranged in common emitter configuration. Negative D.C. feedback is provided between the third and first transistors, and other forms of degeneration are also utilized.

DRAWINGS

*FIG. 1*

DESCRIPTION

Figure 1:
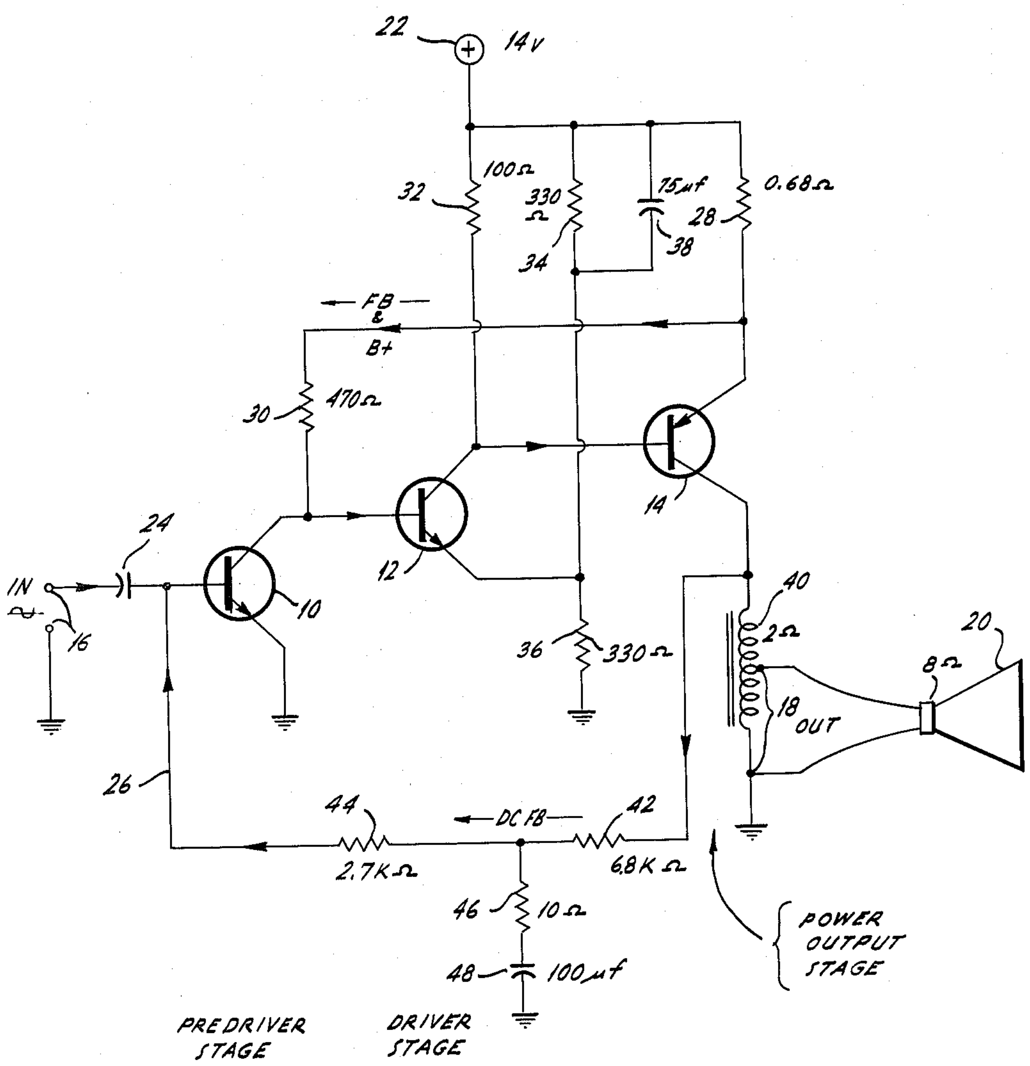
FIG. 1 shows a complementary circuit according to the invention wherein separate feedback paths are used.

The amplifier of FIG. 1 includes three transistors, 10, 12, and 14, connected in cascade fashion. Transistor 14 is a power transistor of the PNP type, while NPN transistors 10 and 12 are predriver and driver transistors, respectively. The foregoing conductivity types may be reversed if the polarity of the power supply is reversed.

An input signal to be amplified is applied at input terminals 16. An output signal, which is a linearly amplified version of the input signal, is obtained at terminals 18. A specific exemplary load 20, to-wit, a loudspeaker, is shown connected between terminals 18. The source of operating voltage for the system is schematically represented by terminal 22.

The input signal present at terminal 16 is applied to the base of transistor 10 of the predriver stage via coupling capacitor 24. The emitter of transistor 10 is grounded, and the collector is supplied with operating currents from source 22 via resistors 28 and 30.

The collector of transistor 10 of the predriver stage is directly coupled to the base of transistor 12 in the driver stage. The collector of transistor 12 is supplied with operating current from source 22 via resistor 32. The emitter of transistor 12 is connected to the junction point of voltage divider resistors 34 and 36 with resistor 34 being by passed by capacitor 38.

The collector of transistor 12 is directly coupled to the base of transistor 14 of the power output stage.

The emitter of transistor 14 is supplied with operating current from source 22 via resistor 28. Autotransformer 40 is connected between the collector of transistor 14 and ground. A feedback circuit comprising two series connected resistors 42 and 44, the junction of which is connected to ground via resistor 46 and capacitor 48, is coupled from the collector of transistor 14 to the base of transistor 10 by way of connection 26. Speaker 20, the circuit load, is connected to terminals 18, one of which is a tap on autotransformer 40 and the other of which is at ground potential.

Component values found to give optimum performance in one practical embodiment of the invention appear in terms of ohms and microfarads adjacent their respective components. Transistors 10 and 12 may be of the silicon planar variety, for example, GE type 16B–1 (4JD18), and transistor 14 may be of the type 2N257. However the invention is not rstricted to these transistor types.

OPERATION

An input signal applied to terminals 16 undergoes three stages of conventional cascade amplification in the predriver, driver, and output stages shown, so that a greatly amplified signal current flows in autotransformer 40 in the output stage.

Autotransformer 40, by providing a relatively low impedance path in parallel with speaker 20, serves to divert most of the direct current flowing through transistor 14 from speaker 20, thus increasing the power-handling capacity of speaker 20 for alternating current signals. Autotransformer 40 also effectively transforms the impedance of speaker 20 to match the power capability of transistor 14. The location on the autotransformer of tap 18 should be suitably chosen for this purpose.

A feedback signal taken across autotransformer 40 is used to compensate for leakage current and beta variations. Almost all of the A.C. components in the feedback signal are eliminated by shunt capacitor 48, which connects the junction of isolating resistors 42 and 44 in the feedback path to ground. Resistor 46, in series with capacitor 48, allows a small amount of high frequency A.C. feedback which otherwise might all be shunted to ground by capacitor 48. This equalizes the amplifier's inherent tendency to produce more gain at higher frequencies. The resulting direct current feedback signal on lead 26 is amplified in the predriver and driver stages and applied to the base of transistor 14 where it tends to oppose and thus compensate gain variations caused by leakage current variations or beta changes due to substitution or replacement of transistor 14. It will be appreciated that since the conductivity type of output transistor 14 is opposite to that of predriver and driver transistors 10 and 12, the collector potential of transistor 14 will be close to reference potential and the base-emitter potential of predriver transistor 10, thus allowing a large amount of negative D.C. feedback according to the invention to be supplied over resistors 42 and 44 while still maintaining the correct base bias on transistor 10.

Temperature stabilization is also provided by deriving the feedback signal across the autotransformer. The D.C. resistance of autotransformer 40, which changes with ambient temperature, is made to compensate for temperature sensitive gain changes in transistor 14 by deriving the negative D.C. feedback signal for transistor 14 from across autotransformer 40.

Combined A.C.–D.C. stabilizing feedback is also supplied from the emitter of transistor 14 to the base of transistor 12 via resistor 30. Emitter degeneration is provided in the power output stage by resistor 28. Resistors 36 and 34 also form a voltage divider to raise the emitter voltage of transistor 12 above ground, thereby lowering the overall voltage supplied across transistor 12 and reducing the circuit's power requirement.

Capacitor 38 provides an audio bypass for the emitter circuit of transistor 12. It is connected from the emitter to source 22 (rather than emitter to ground) to couple noise pulses appearing in source 22 to the emitter of transistor 12 so that the effect of the same noise, which is also resistively coupled to the bases of transistors 12 and 14 from source 22, may be cancelled.

The substantially D.C. feedback path including resistors 42 and 44 will provide approximately 5 to 7 db of feedback, while the A.C.–D.C. feedback path including resistor 30 will provide approximately 4 to 15 db of feedback, depending on the beta of transistor 14.

*FIG. 2*

DESCRIPTION

Figure 2:
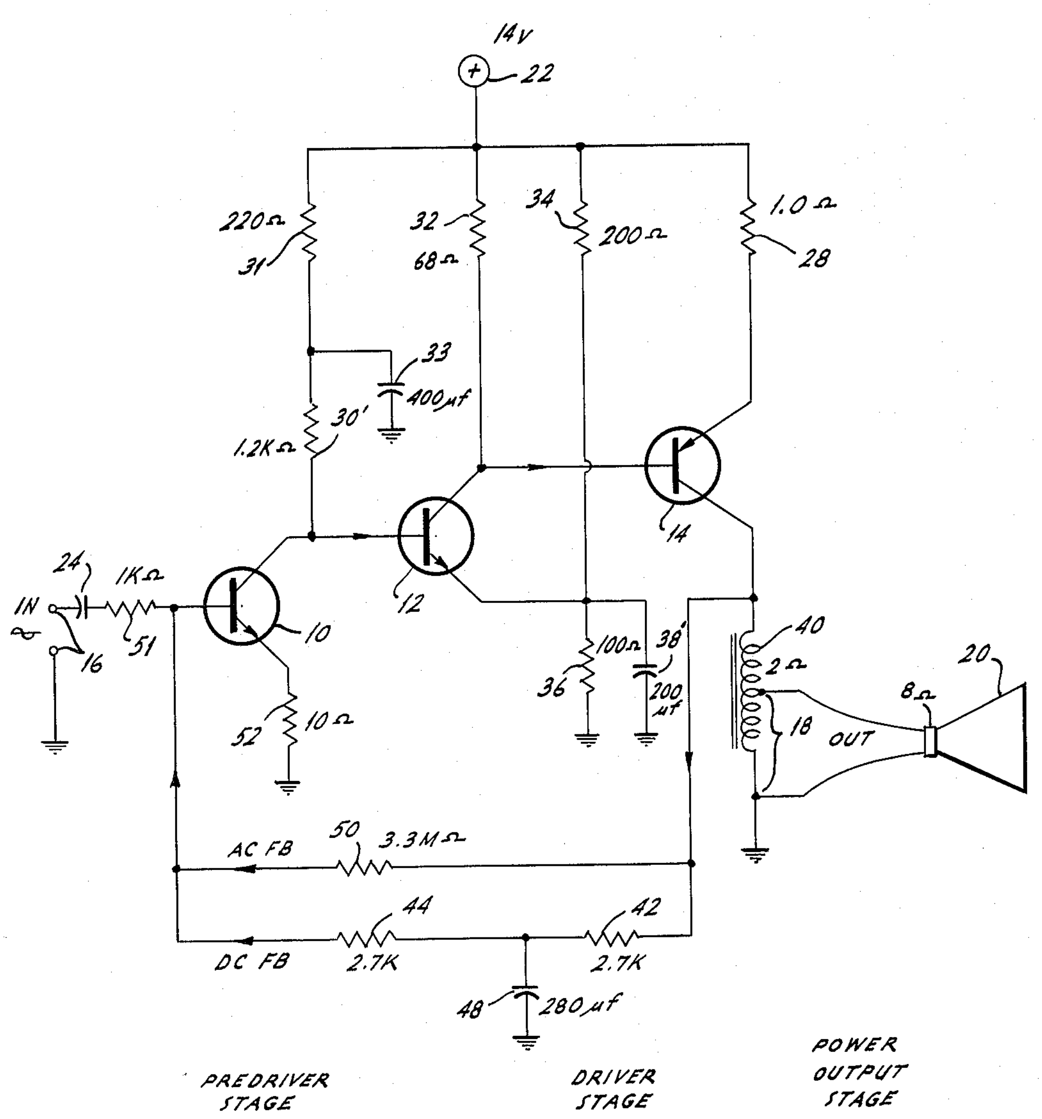
FIG. 2 shows the preferred embodiment of a complementary version of the invention wherein a single A.C.–D.C. feedback path is used.

The circuit of FIG. 2 is a modification of the circuit of FIG. 1 and includes the following changes for increasing noise immunity and linearity. (1) The feedback path from the emitter of transistor 14 to the base of transistor 12 is omitted and the collector resistor 30 of transistor 10, now designated 30', is connected to source 22 via resistor 31 which is bypassed by filter capacitor 33. (2) Resistor 46, which was in series with capacitor 48 in FIG. 1, is omitted and a new resistor 50 is connected in shunt with resistors 44 and 42 from the collector of transistor 14 to the base of transistor 10. Resistor 51 is provided in series with capacitor 24 to provide isolation for the A.C. feedback provided by resistor 50. (3) A resistor 52, not present in FIG. 1, is connected in the emitter circuit of transistor 10. (4) Capacitor 38, now designated 38', is connected from to the junction of resistors 34 and 36 to ground rather than to source 22. (5) Values of certain components are different from those shown in FIG. 1.

OPERATION

The operation of the circuit of FIG. 2 is similar to that of FIG. 1.

The A.C. feedback in FIG. 1 from the emitter of transistor 14 to the base of transistor 12 has been replaced by feedback from the collector of transistor 14 to the base of transistor 10 via resistor 50. This substitution was found to provide superior noise immunity and effects overall rather than two-stage feedback.

The insertion of resistor 50 also provides high frequency A.C. feedback and eliminates the need for resistor 46 of FIG. 1. Resistor 52 in the emitter circuit of transistor 10 provides degeneration and improves the linearity of the predriver stage. Capacitor 38' provides a conventional bypass rather than noise compensation. The increased size of capacitor 38 enables it to provide the power supply noise eliminating function which it fulfilled as a noise compensator in FIG. 1.

Typically, the amplifiers of the invention provide about 85 decibels of power gain and will normally deliver 2 watts of output power. The circuits demonstrate extremely high stability despite leakage current variations caused by different output transistors or temperatures cycling. The circuits are very simple and use the standard, high-gain common emitter configuration. The invention is not limited to the complementary NPN–NPN–PNP configuration shown, but may include transistors which are all of the same conductivity. For example with a positive power supply battery three NPN transistors may be cascaded. The primary of a speaker driver transformer should be connected in the collector circuit of the output transistor and the loudspeaker should be connected across the transformer's secondary winding. The D.C. feedback according to the invention may be derived across a small resistor connecting to the output transistor's emitter to ground. An emitter follower should be used as the driver transistor to apply the D.C. feedback signal to the output transistor in the proper phase to effect negative feedback. All PNP transistors may be connected in similar fashion if a negative supply is used.

The specificities of the foregoing description are not to be considered as indicative of the scope of the invention; the latter is defined only by the appended claims.

We claim:

1. A transistor amplifier, comprising:

(a) a first amplifier stage including a first transistor of one conductivity type arranged in the common emitter configuration, (b) a second amplifier stage including a second transistor of said one conductivity type arranged in the common emitter configuration, the output of said first stage being direct-current coupled to the input of said second stage, (c) a third amplifier stage including a third transistor of an opposite conductivity type arranged in the common emitter configuration, the output of said second stage being direct-current coupled to the input of said third stage, (d) a source of operating potential for said three stages, means connected one terminal of said source to the emitter of said first and second transistors and to the collector of said third transistor, said means including a load impedance connected to the collector of said third transistor, additional means connecting the other terminal of said source to the collectors of said first and second transistors via respective load impedances and to the emitter of said third transistor, (e) means for supplying negative direct-current feedback from the output of said third stage to the input of said first stage, said means comprising a feedback path whose impedance to feedback signals increases with frequency.

2. The amplifier of claim 1 wherein said feedback path is connected between the collector of said third transistor and the base of said first transistor.

3. The amplifier of claim 1 further including means for supplying negative feedback from the emitter of said third transistor to the base of said second transistor.

4. The amplifier of claim 1 wherein an additional feedback path whose impedance is substantially frequency independent is provided in parallel with said first-named feedback path.

5. The amplifier of claim 1 wherein said load impedance comprises a transformer winding and wherein one end of said feedback path is connected to a terminal of said transformer winding remote from said other terminal of said source, whereby temperature induced gain changes in said third transistor will be compensated by temperature induced resistance changes of said transformer winding.

6. A transistor amplifier, comprising:

(a) a source of supply potential, (b) first, second, and third common emitter inverting amplifier stages connected in cascade, said stages including first, second, and third transistors, respectively, said first and second transistors being of a first conductivity type, the emitter of each coupled to one terminal of said source and the collector of each coupled to the other terminal of said source, said third transistor being of the opposite conductivity type, the collector thereof connected to said one terminal of said source via a load impedance and the emitter thereof coupled to the other terminal of said source, (c) negative feedback means connected between the collector of said third transistor and the input of said first stage, said means being arranged to provide a substantially higher impedance to alternating current components than to direct-current components of applied signals.

7. The amplifier of claim 6 wherein said load impedance comprises a temperature sensitive transformer winding, whereby temperature stability of said amplifier is enhanced.

8. The amplifier of claim 6 wherein the collector of said first transistor and the emitter of said third transistor are both connected to said other terminal of said source via the same impedance.

9. In combination:

(a) a first transistor of a given conductivity type having base, emitter, and collector electrodes, said emitter electrodes being connected to reference potential, said collector being connected to a source of operating potential via a series path including first and second resistors, (b) a second transistor of said given conductivity having base, emitter, and collector electrodes, said base electrode being directly connected to the collector of said first transistor, means connecting said emitter to reference potential, said collector being connected to said source of operating potential via a third resistor, (c) a third transistor of opposite conductivity to said former two transistors, and having base, emitter, and collector electrodes, said base being directly connected to the collector of said second transistor, said emitter being connected to the junction of said first and second resistors, and said collector being connected on one terminal of a load, the other terminal of which is connected to reference potential, said collector also being connected to the base of said first transistor via a feedback path including at least one impedance.

10. The combination of claim 9 wherein:

(a) the emitter of said second transistor is connected to a junction between respective terminals of fourth and fifth resistors, the opposite terminals of which are connected to reference potential and said source of supply voltage, respectively, said fifth resistor being parallel by a capacitor, and (b) the collector of said third transistor is connected to said load by means of an autotransformer having first and second end terminals connected to said collector and reference potential, respectively, whereby ambient temperature changes create resistance variations in said autotransformer which cause feedback voltage variations serving to compensate for corresponding temperature sensitive gain changes in said third transistor.

References Cited by the Examiner

UNITED STATES PATENTS

| | | | |
|---|---|---|---|
| 2,882,350 | 4/1959 | Stern et al. | 330—17 |
| 2,916,565 | 12/1959 | Ensink et al. | 330—28 |
| 2,945,187 | 7/1960 | McCollom | 330—24 |
| 3,001,145 | 9/1961 | Bradmiller | 330—28 X |
| 3,018,444 | 1/1962 | Offner | 330—28 X |
| 3,030,586 | 4/1962 | Paz et al. | 330—19 |
| 3,040,264 | 6/1962 | Weidner | 330—28 X |
| 3,167,721 | 1/1965 | Broadnead | 330—149 X |
| 3,179,894 | 4/1965 | Bloom | 330—17 |

OTHER REFERENCES

A. R. Owens: "Direct-Coupled Transistor Amplifier," Wireless World, vol. 64, pp. 327–8, July 1958.

ROY LAKE, *Primary Examiner.*

R. P. KANANEN, *Assistant Examiner.*